United States Patent [19]
Giardina et al.

[11] Patent Number: 5,605,715
[45] Date of Patent: Feb. 25, 1997

[54] METHODS FOR MAKING ELECTRICAL CIRCUIT DEVICES

[75] Inventors: Richard N. Giardina; Craig C. Sundberg; Joseph J. Herbert, all of Erie, Pa.

[73] Assignee: The Erie Ceramic Arts Company, Erie, Pa.

[21] Appl. No.: 164,297

[22] Filed: Dec. 9, 1993

[51] Int. Cl.$^6$ .............................. B05D 5/12; H01R 43/16
[52] U.S. Cl. ...................... 427/96; 427/126.2; 427/259; 427/282; 29/874; 29/877; 174/260; 174/261; 174/262; 361/767; 204/490; 204/493
[58] Field of Search .................................... 427/96, 126.2, 427/259, 261, 279, 282, 287, 330, 374.7; 29/874, 877; 174/260, 261, 262; 361/767; 204/492, 493

[56] References Cited

U.S. PATENT DOCUMENTS

| | | | |
|---|---|---|---|
| 2,859,321 | 11/1958 | Garaway | 201/73 |
| 3,473,146 | 10/1969 | Mulligan | 338/293 |
| 3,514,538 | 5/1970 | Chadwick et al. | 174/8.5 |
| 3,575,838 | 4/1971 | Hughes | 204/181 |
| 3,841,986 | 10/1974 | Rion et al. | 204/181 |
| 3,928,837 | 12/1975 | Esper et al. | 338/22 R |
| 3,935,088 | 1/1976 | Kaup et al. | 204/181 |
| 4,033,832 | 7/1977 | Sterling | 204/15 |
| 4,085,021 | 4/1978 | van der Vliet | 204/181 N |
| 4,172,733 | 10/1979 | Moritsu et al. | 106/1.15 |
| 4,188,415 | 2/1980 | Takahashi et al. | 427/97 |
| 4,256,796 | 3/1981 | Hang et al. | 428/210 |
| 4,294,009 | 10/1981 | Quintin et al. | 29/832 |
| 4,328,614 | 5/1982 | Schelhorn | 29/842 |
| 4,342,020 | 7/1982 | Utner et al. | 338/314 |
| 4,358,541 | 11/1982 | Andrus et al. | 501/5 |
| 4,361,651 | 11/1982 | Ohmura et al. | 501/21 |
| 4,365,168 | 12/1982 | Chaput | 307/115 |
| 4,371,861 | 2/1983 | Lipp et al. | 338/174 |
| 4,385,127 | 5/1983 | Chyung | 501/5 |
| 4,827,769 | 5/1989 | Riley et al. | 73/313 |
| 4,997,698 | 3/1991 | Oboodi et al. | 428/209 |
| 5,002,903 | 3/1991 | Lim et al. | 501/26 |
| 5,192,940 | 3/1993 | Yajima et al. | 338/308 |

*Primary Examiner*—Shrive Beck
*Assistant Examiner*—Brian K. Talbot
*Attorney, Agent, or Firm*—Rankin, Hill, Lewis & Clark

[57] ABSTRACT

The invention provides a method for making an electrical circuit device as well as a resulting device itself. The method includes the steps of forming a base or substrate of conductive metal and then securing an electrically conductive masking element to the substrate. The resulting product is coated with a layer of fusible particles of a dielectric or resistive material that is repelled by the surface of the masking element. The coated product is then heated to fuse the particles and provide a hard dielectric or resistive layer over surface portions of the base. The masking element provides an exposed conductive path to the base metal or substrate. A section of conductive metal foil may be bonded to the masking element to provide a continuous conductive bus on the substrate.

12 Claims, 4 Drawing Sheets

METHODS FOR MAKING ELECTRICAL CIRCUIT DEVICES

FIELD OF THE INVENTION

This invention relates to electrical circuit devices, wherein conductive patterns are applied to the surfaces of porcelain enameled steel or other glass or ceramic coated metal substrates. More particularly, the invention relates to methods for forming such devices and especially to the forming of an electrically conductive path between a portion of a conductive pattern on a dielectric surface of the device through to the metal substrate. The invention also relates to the devices formed in accordance with the methods of the invention.

BACKGROUND OF THE INVENTION

One particular type of electrical circuit device that has a porcelain enameled steel or other glass or ceramic coated metal substrate is produced by punching out metal stampings in various shapes from sheet metal of a desired thicknesses. After a metal pretreatment, these metal stampings are electrophoretically dipcoated in a slurry of particles formed of porcelain enamel or other dielectric or resistive materials. Then the coated product is fired (i.e. heated to a sintering or fusing temperature) for a period of time sufficient to sinter or fuse the coating or deposit and create a bond between the sintered layer and the metal surface of the substrate.

The resulting coated metal substrate can be used for circuit boards, thermal sinks, thermal barriers, RF shielding, magnetic flux conduction, mechanical attachments and other related applications. Such coated metal substrates that are coated with a porcelain enamel material are commonly referred to as porcelain enameled metal substrates (PEMS) or ceramic coated metal substrates (CCMS).

Discrete metal foils can be attached to the resulting ceramic coated metal substrates by means of conventional techniques, such as soldering, adhesive attachment, etc. The metal foil patterns can serve as switch contacts, circuit traces to carry current, and terminals for interconnection of external wires.

In products of this type, it is often desirable to create a void or via in the sintered coating so that a portion of the conductive pattern formed on the dielectric or electrically resistive surface can be electrically connected to the base metal which is typically a conductive metal such as steel. These voids or access areas can be designed in any desired configuration although it has been determined that the area is desirably less than half of the total surface area of the substrate.

In the prior art, the creation of voids in the dielectric or resistive surface coating has been difficult and expensive. One method of forming a void is to abrade or wear away the dielectric material from the underlying base metal. This abrading process generates considerable dust and potentially exposes workers to a hazardous environment thereby requiring that certain safeguards be employed. Normally, a special mask is required, and following the operation, quantities of dust and dirt must be removed from the work area. Also, a secondary cleaning operation is generally required. This process alone does not prepare the surface of the metal substrate to receive a conductive layer such as a thick film. Additional steps must be taken in order to achieve a mechanical bond between a thick film and the resulting exposed surface portion of the substrate. This approach to creating voids or access to the base metal is quite costly and not suitable for creating relatively large area voids.

A related problem with prior art circuit devices having porcelain enameled steel or other glass or ceramic coated metal substrates, relates to the application of a conductive pattern to the dielectric or resistive surface. For example, when a thick film-type conductive layer is applied, the film may serve some purposes adequately, such as in the case of a low current rheostat, however, the thick film conductor fails frequently when subjected to repeated high current on/off (or open circuit, closed circuit) conditions. The failure results from the cycling of the switching device under relatively high current conditions.

One solution to this problem has been to apply a shaped stainless steel or copper foil to the surface of a thick film conductor pattern. This may be done, for example, by soldering and achieves what might be termed a hybrid conductor bus. One application of this device, for example is a switch, wherein the foil surface is contacted by one or more spring loaded contact fingers on a rotating rheostat. The coated substrate may be located inside a rheostat housing and the mechanical detent of the switch housing may be used to achieve on or off circuit conditions. One of the contactors wipes across or maintains contact with the hybrid conductor bus at all times while another contactor, depending upon the position of the coated substrate, wipes across the dielectric or resistive surface portion or another metal foil portion of the hybrid conductor bus.

While the soldered metal foils on the thick film have been capable of handling the current level involved, they have presented other difficulties. For example, the tactile response or "feel" perceived by the human operator as the substrate is rotated through the on/off positions of the rheostat housing has an irregular or "bumpy" feeling.

Another problem occurs when a contact finger instantaneously connects to a stainless steel hybrid bus. Due to the high current being switched at the point of initial contact, a small arc occurs between the contact finger and the stainless steel foil. This arc may cause the contact finger and the stainless steel foil to weld together momentarily. These problems often result from the difference in elevation between the dielectric coated substrate surface and the contact surface of the metal foil. Also, they occur as a result of the weld characteristics of the materials used in both the stainless steel foil and the spring-loaded contact finger.

The methods and resulting devices of the present invention resolve the difficulties described above and afford other features and advantages heretofore not obtainable.

SUMMARY OF THE INVENTION

The methods of the present invention produce an electrical circuit device, wherein certain surface areas are electrically conductive and other surface areas are electrically non-conductive. The methods generally include the steps of forming a base or substrate of electrically conductive material and then securing an electrically conductive masking element formed of an immiscible material, to a discrete surface portion of the base or substrate and in electrically conductive contact therewith. The resulting product is then coated over other surface portions thereof with a layer of fusible particles such as porcelain enamel or other glass or ceramic materials that are adhered to the other surface portions, but repelled from the surface of the masking element so that the surface of the masking element remains generally exposed.

The coated product is then heated to a sintering or fusing temperature for a predetermined period of time to fuse the particles and provide a relatively hard dielectric layer over the respective surface portions of the base. Nevertheless, the masking element provides an exposed conductive path or via to the base metal.

The resulting product can be used to produce a variety of electrical circuit devices, wherein conductive patterns are formed on the resulting dielectric surface with portions thereof contacting the exposed masking element that provides a conductive path to the base metal.

Dielectric or resistive surface portions of both sides of the coated device may have circuit patterns formed thereon. The conductive circuit patterns may be formed by the use of thick films and other metallic pastes applied on the dielectric surface, and may include the application of a foil, such as copper foil, over the exposed surface of the masking element. The latter practice can be used to achieve a flush or near flush relationship between the dielectric or resistive surface and the conductive surface of the foil.

By varying the foil thickness, a variety of topographical conditions can be obtained. The problem of arc welding, referred to above, can be solved by using a copper alloy foil to form a hybrid conductor, the copper alloy having a low electrical resistance.

The mask element may be, for example, a thick-film pattern formed of a nickel alloy that is applied, for example, by screen printing onto the surface of the metal substrate. Nickel alloy thick film is an immiscible material that resists or repels the slurry of fusible particles.

The application of the coating layer of fusible particles of dielectric or resistive material may be accomplished by electrocoating processes or electrophoresis.

DESCRIPTION OF THE PREFERRED EMBODIMENT

Figure 1:
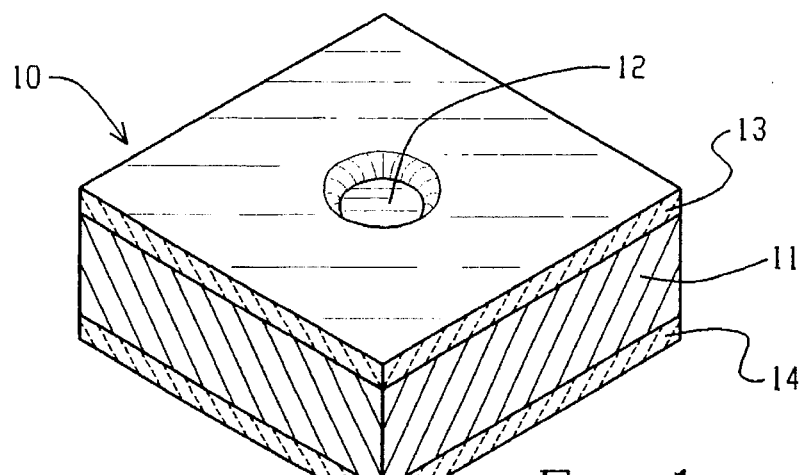
FIG. 1 is a fragmentary perspective view of a portion of an electrical device embodying the invention with portions broken away and shown in section.
Figure 2:
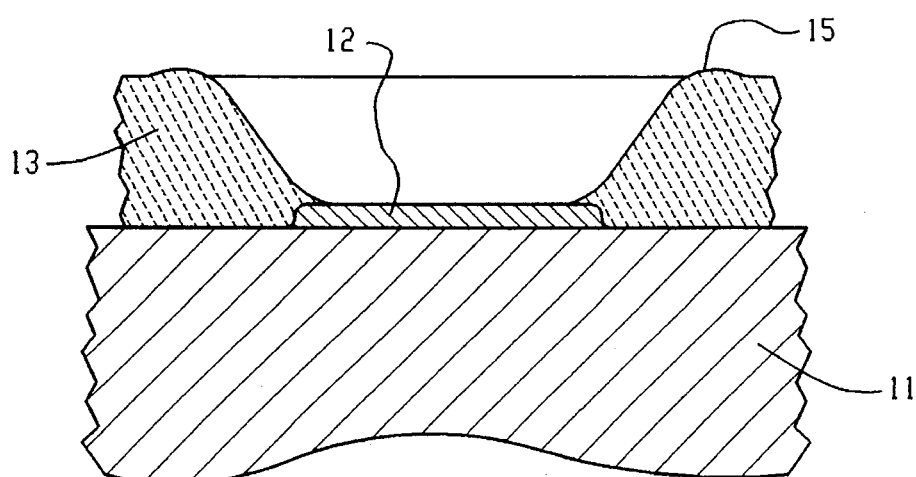
FIG. 2 is a fragmentary sectional view taken on the line 2—2 of FIG. 1 illustrating the coated substrate of FIG. 1 having a conductive path formed from the surface through to the metal substrate.
Figure 3:
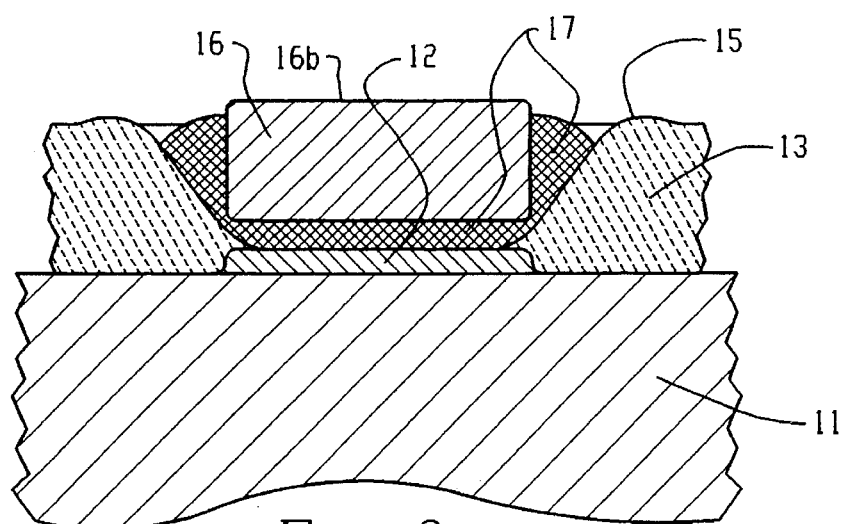
FIG. 3 is a fragmentary sectional view similar to FIG. 2 showing a conductive metal foil applied over the conductive surface of the electrically conductive contact element to provide a portion of a circuit pattern.

Referring more particularly to the drawings and initially to FIGS. 1, 2 and 3, there is shown a portion of an electrical circuit device 10, wherein a conductive metal substrate or base 11 formed, for example, of decarburized steel, has upper and lower layers 13 and 14 of a dielectric material such as a conventional porcelain enamel material bonded thereto. A selected surface portion of the substrate 11 has an electrically conductive masking element 12 secured thereto in such a way as to provide electrical contact therebetween.

The element 12 is formed of an electrically conductive material that is immiscible, or in other words, that resists or repulses the dielectric material utilized to form the layers 13 and 14. This results in the outer surface of the contact element 12 being free of the dielectric material, and thus exposed as illustrated in FIGS. 1 and 2. It will be noted that the upper layer 13 of dielectric material is thicker than the contact element 12 so that the surface of the contact element 12 is recessed well below the outer surface of the layer 13. Also, a typical coating process produces an annular ridge or meniscus 15 around the recess located over the element 12.

In accordance with one aspect of the invention shown in FIG. 3, a metal foil pattern 16 is applied to the element 12 using cement 17. The foil pattern 16 includes a portion 16b that extends over the recessed portion. The conductive metal foil pattern 16 is adhered in the recess using a dielectric adhesive or cement 17 for example, so that no electrical contact is provided through the cement 17 to the masking element 12 and thus, to the substrate 11. An example of a preferred dielectric cement is a product sold by the Ferro Corporation under the trade designation FX-11-069. It will be appreciated that if one desires to provide an electrical contact between foil 16 and element 12, a conductive thick film such as that sold by Electro Science Labs (ESL) under the trade designation 1900 may be utilized.

Metal foil 16 comprises a copper alloy such as C11000 ETP copper. However, it will be appreciated the any number of metal foil products may be utilized comprising any number of materials such as, for example, other copper alloys, stainless steel, aluminum, silver, gold, palladium and nickel. Foils utilized generally are about 0.008" thick but they may range from about 0.001" to about 0.025" in thickness.

One typical procedure for forming the dielectric layers 13 and 14 is accomplished as follows:

The decarburized steel metal base 11 is formed by stamping a piece coupon from a steel sheet of a desired thickness. The coupon is treated by pickling or some other conventional metal pretreatment process. Then a thick film of conductive but immiscible material such as a nickel alloy thick film is printed, such as by screen printing, brushing, fluid dispensing or spraying at a desired location on this respective surface of the metal base or substrate 11.

The resulting product is emersed in a conventional acidic copper sulphate solution for a brief period of time (about 1 minute) after which it is dipped in a slurry of dielectric particles such as conventional porcelain enamel particles. Within the slurry are fixed cathodes and the preliminary assembly or substrate is electrically connected in such a way that it acts as an anode and attracts the solid particles in the slurry by electrophoresis. As a result, the dielectric particles are deposited on both surfaces of the base or substrate 11 to form a coating. However, the thick film of conductive material. (masking element) resists the permanent attachment of the particles due to its immiscible character.

When the coated product is removed from the slurry, it is dried and then heated or fired to a sintering temperature such as around 1500° F. Of course, it will be appreciated that the exact sintering or fusing temperature and time will depend upon the particular dielectric or resistive material being used. During the sintering process the masking element in most situations also serves to ensure that a conductive via is formed (i.e., that the portion of the substrate that is not coated with the dielectric or resistive material does not form a non-conductive oxide coating during sintering). The resulting product is illustrated in FIGS. 1 and 2, and it will be noted that the masking element 12 has resisted the coating of dielectric material so it has an electrically conductive exposed surface and thus a via formed in the layer 13. Thus, it will be appreciated that the masking element also serves during sintering to ensure that the metal base does not burn or become excessively oxidized and hence electrically resistive.

A typical thick film that may be used in the process when utilizing a ferrous substrate is a product identified by the trade designation 2554 or 2554-E and sold by Electro Science Labs (ESL). This product is a nickel cermet thick film. It consists of nickel particles held together in a matrix of boro-silicate glass. Preferably, in order to facilitate its application the thick film is diluted with a Drakenfeld oil sold under the trade designation 401. The proportions are generally about 3% by weight oil to about 97% by weight thick film. It will be appreciated that in addition the above identified thick films, any number of other conventional thick film or metal paste products may be utilized so long as they form a conductive coating and prevent or resist the deposition of the dielectric or resistive material. Additionally, when utilizing stainless steel substrates, applicants believe that it should be possible to use a nonmetallic oil based resist that is completely volatilized and removed during the sintering step thereby providing a conductive via without the use of a thick film or metallic paste.

Any number of conventional dielectric or resistive coating materials may be used in connection with the present invention. Such coatings may be classified as either "porcelain enamel," "glass" or "ceramic." Such "porcelain enamel" or "glass" coatings may be referred to as "vitreous" coatings. Such "ceramic" coatings may be referred to as "devitrified" coatings. Examples of such coatings may be found in Lim et al., U.S. Pat. No. 5,002,903; Ohmura et al., U.S. Pat. No. 4,361,654; Kaup et al., U.S. Pat. No. 3,935,088; Moritsu et al., U.S. Pat. No. 4,172,733; Van derVliet, U.S. Pat. No. 4,085,021; Hang et al., U.S. Pat. No. 4,256,796; Andrus et al., U.S. Pat. No. 4,358,541; Chyung, U.S. Pat. No. 4,385,127; Gazo et al. U.S. Pat. No. 3,841,986 and Hughes U.S. Pat. No. 3,575,838. Applicants hereby incorporate by reference the coatings disclosed in such U.S. Patents including the methods of making such coatings and applying such coatings to a metal substrate.

It will be appreciated that any number of coating techniques and baths, dielectric or resistive coatings, and firing temperatures may be utilized when practicing the present invention. Such parameters are generally a function of the type of substrate utilized.

It will be appreciated that any number of metal substrates may also be used in connection with the present invention. Such substrates may comprise for example, a ferrous alloy such as carbon steel(including low carbon steel) or stainless steel, copper, aluminum, decarburized steel and copper-beryllium.

Figure 4:
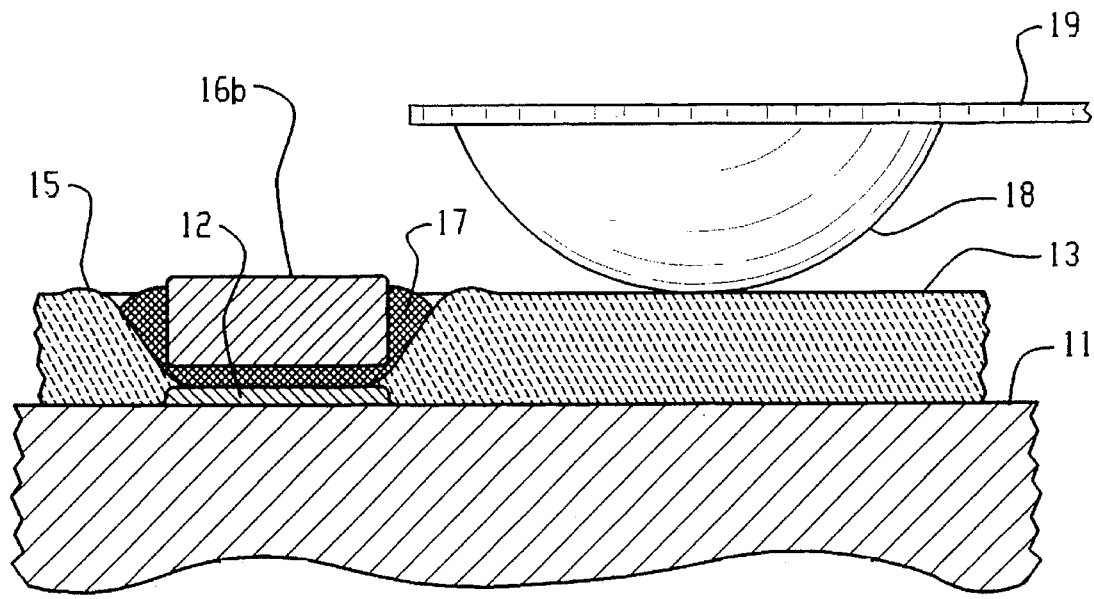
FIG. 4 is a fragmentary sectional view similar to FIG. 3 but on a smaller scale illustrating an electrical circuit element embodying the invention with a circuit pattern formed on one surface in a way that provides a conductive path to the substrate, but formed on the other surface by application over the dielectric coating.

FIG. 4 shows a particular application of the device of FIG. 3, wherein the electrical circuit has a switching function. An electrical contact 18 is carried on a contact arm 19 in relatively moving engagement with the surface of the device 10 having the foil pattern applied thereon. The contact 18 as shown in FIG. 4, is in an "off" position, or in other words, out of contact with any conductive part of the circuit pattern. When relative movement occurs between the device 10 and the contact 18 in such a way that the contact moves to the left, it will engage and wipe across the surface of the foil portion 16b to provide electrical contact through the foil to the masking element 12, and thus to the base or substrate 11.

Figure 5:
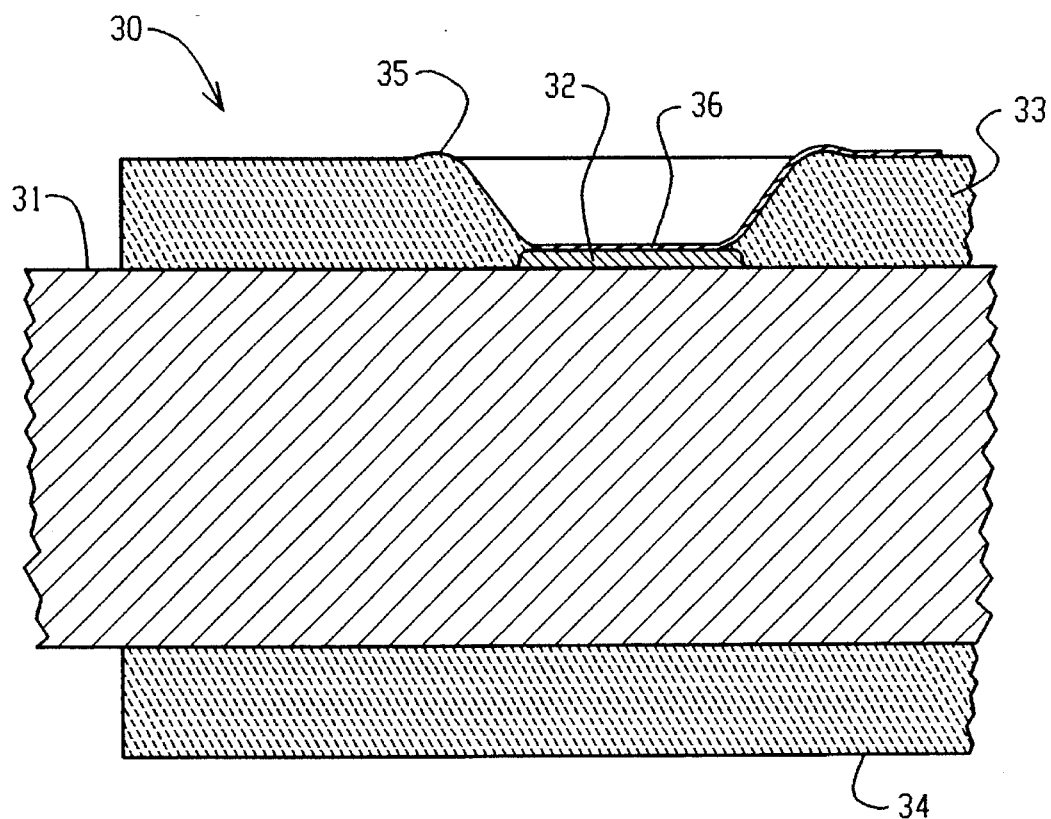
FIG. 5 is a fragmentary sectional view similar to FIG. 3 but showing a portion of a circuit pattern formed by applying a thick film conductive material over the surface to include the portions having a conductive path to the base metal.

FIG. 5 illustrates another embodiment of the invention, wherein a device 30 similar to the device 10 of FIGS. 1–3 is formed from a conductive metal substrate 31 with a masking element 32 formed of conductive but immiscible material over a portion thereof, and with upper and lower dielectric or resistive layers 33 and 34 applied to the opposite surface of the substrate 31. In this instance, a circuit pattern is applied to the upper surface of the device in such a way that portions lie over the dielectric or resistive layer 33 and at least one portion 36 extends over the top surface of the element 32, so as to place a portion of the circuit pattern in electrically conductive contact with the substrate 31.

Figure 6:
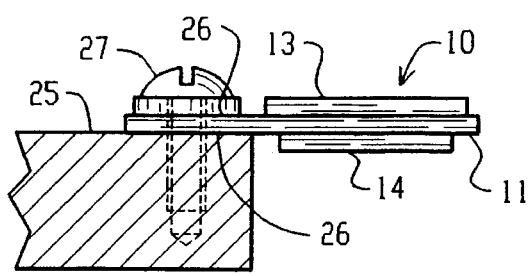
FIG. 6 is a fragmentary sectional view showing the mounting of a circuit device embodying the invention to a structural.
Figure 7:
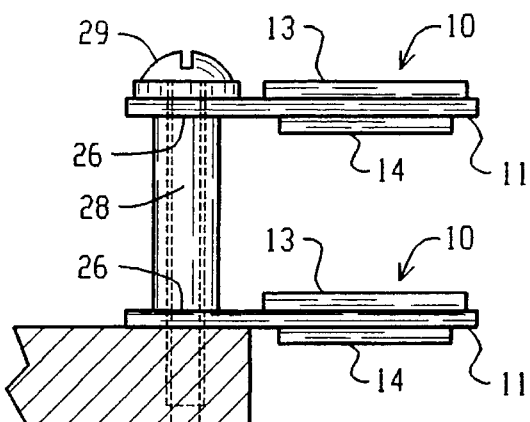
FIG. 7 is a fragmentary sectional view similar to FIG. 6 but showing a pair of electrical circuit devices embodying the invention mounted to a supporting structure using a spacer sleeve to provide grounding contact between the substrates of both devices.

FIGS. 6 and 7 illustrate screw or bolt mounting techniques for circuit devices such as printed circuit boards embodying the present invention. The particular device 10 has a conductive metal base or substrate 11 provided with upper and lower surface layers 13 and 14 of a dielectric or resistive material, but having extending mounting portions 26 that are free of the dielectric or resistive layers to provide exposed conductive surfaces. FIG. 6 illustrates one circuit board 10 mounted to a conductive support 25 such as a grounded portion by means of a screw 27. FIG. 7 illustrates two circuit boards 10 mounted in super posed relation to the conductive support 25 and having tabs or extensions 26 separated by a spacer sleeve 28 and secured by means of a long mounting screw 29.

Figure 8:
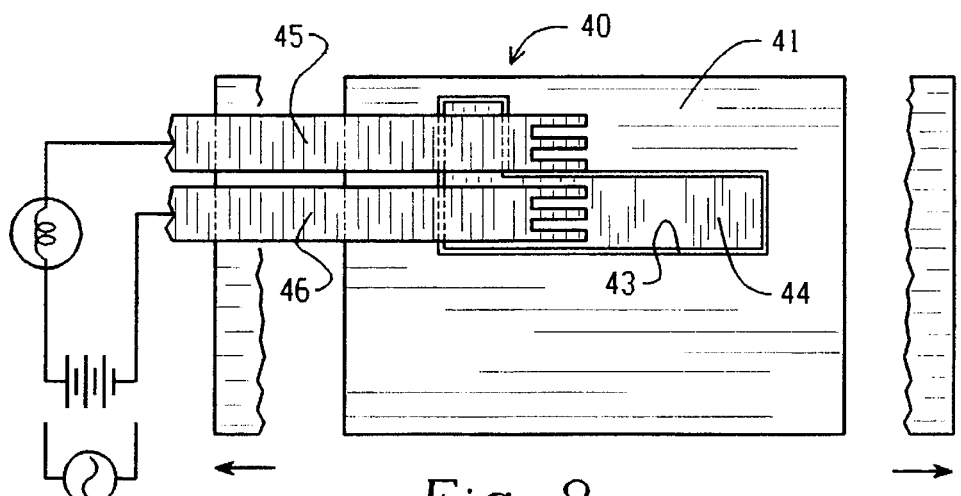
FIG. 8 is a plan view and diagrammatic form illustrating a linear motion switching arrangement including a circuit device embodying the invention.

FIG. 8 shows a linear motion switching device utilizing an electrical circuit component 40 embodying the invention and having a dielectric or resistive layer 41 applied over a conductive metal substrate. This device is formed with an L-shaped coating free zone 43, formed in accordance with the method of the invention described above. An L-shaped conductive film layer may be applied thereto to increase conductivity, the film having dimensions slightly less than those of the underlying exposed conductive zone 43. No metal foil is employed in this embodiment.

A pair of contact arms 45 and 46 having contact fingers or points carried at the ends thereof are located so that the contacts wipe across a conductive surface portion during linear movement as indicated by the arrows. However, the contact portions of the arm 45 contact the dielectric or resistive surface during a part of the linear movement, but come into contact with a conductive surface when the device is moved to the right to the limit position shown.

Figure 9:
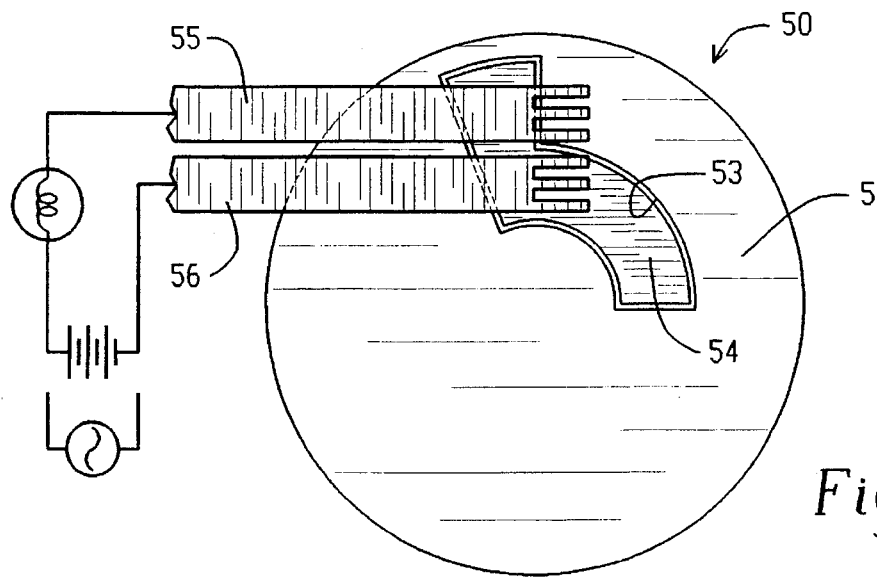
FIG. 9 is a rotary movement switching device utilizing a circuit device embodying the invention.

FIG. 9 illustrates a rotational motion switching device 50 that utilizes a substrate having a layer of dielectric or resistive material 51 applied to its upper surface portions. An exposed portion of the substrate 53 is provided in accordance with the method of the invention to provide a conductive path to the metal substrate, and then a metal foil component 54 is applied over the exposed portion to provide a conductive circuit pattern. A pair of switch arms 55 and 56 carry contacts which provide the switching function.

The contacts of the arm 56 are in continuous electrical contact with the conductive foil throughout the limits of rotary movement of the device as illustrated by the arrows. The contacts of the arm 55, however, normally engage the dielectric surface to provide an "off" condition until the substrate is rotated to a limit position. There, the contacts of the arm 65 engage the metal foil to provide an "on" switching condition.

Figure 10:
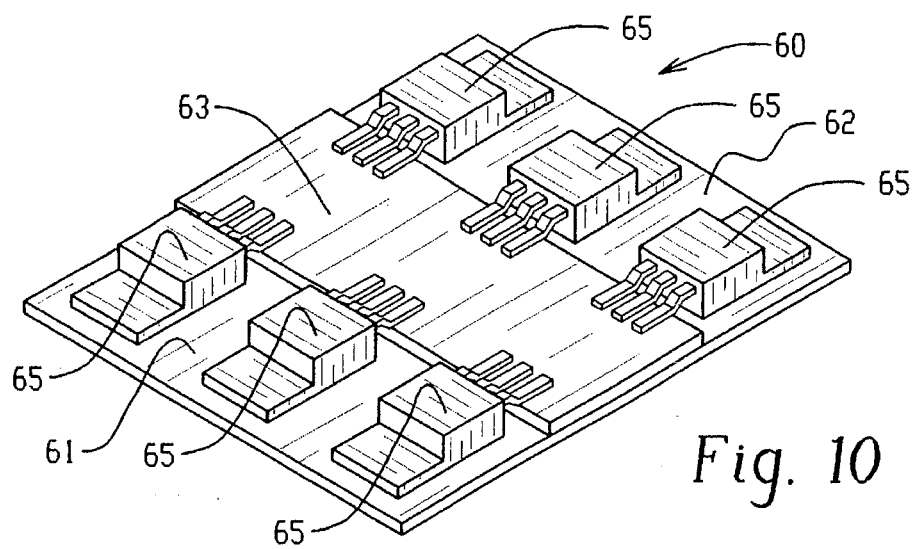
FIG. 10 is a perspective view of an electrical circuit device illustrating an embodiment of the invention.
Figure 11:
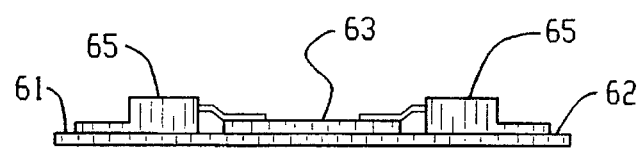
FIG. 11 is a fragmentary sectional view taken on the line 11—11 of FIG. 10.

FIGS. 10 and 11 illustrate an electrical power device embodying the invention, wherein a particular advantage is that a heat transfer path to the substrate is provided for the devices.

Referring to FIG. 10, there is shown an electrical circuit device 60 that includes a conductive metal substrate with rectangular zones 61 and 62 on opposite sides formed of masking strips that are in conductive contact with the metal substrate. Between the zones is a central band provided with a layer 63 of dielectric material. Six electrical power devices 65 are mounted in the zones 61 and 62 to provide heat transfer to the substrate. The central band, however, is provided with a circuit configuration over the dielectric or resistive layer to interconnect the power devices 65 in a desired manner. FIG. 11 is an end elevation of the device of FIG. 10.

Figure 12:
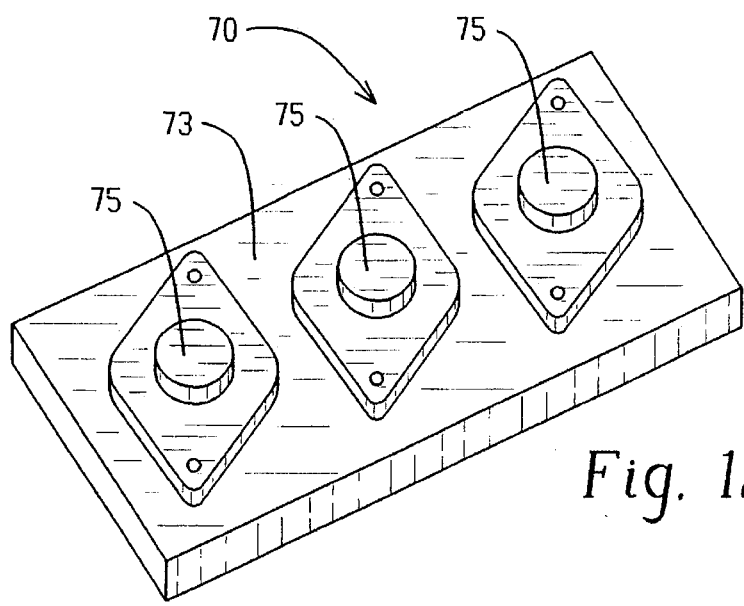
FIG. 12 is a perspective view of another embodiment of the invention.
Figure 13:
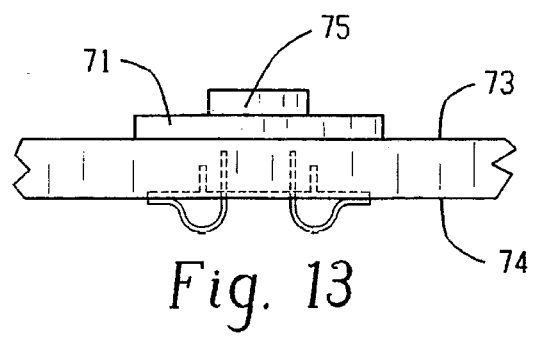
FIG. 13 is a fragmentary sectional view taken on the line 13—13 of FIG. 12.

FIGS. 12 and 13 illustrate another embodiment 70 of the invention, wherein heat transfer contact with a metal substrate is achieved. In this instance, upper and lower surface portions of a metal substrate are provided with a layer of dielectric or resistive material and certain surface zones underlying the power devices are exposed and have electrical contact to the base metal for heat transfer purposes.

In the embodiment 70, however, the base metal has been provided with preformed openings extending therethrough and located within the void areas, so that electrical contact can be provided through the substrate to a conductive pattern formed on the lower surface of the device.

Devices formed in accordance with the foregoing methods of the invention may be used to provide other types of circuit-to-base-metal interconnections and to establish a common ground plane which allows a number of common circuit interconnections in a particular arrangement. The invention also provides mounting sites, where bolt heads can be tightened against the boards base metal or substrate with no chipping to the ceramic coating. Also, mounting cites are provided for direct component heat transfer to the metal substrate by power devices or heat piping devices.

Mounting can be accomplished in these applications by conductive or nonconductive epoxy or other desirable organic glue or with the addition of solderable thick film techniques. Also, the invention can be used in devices where holes are punched through the device at locations that are exposed and free of the dielectric or resistive layer.

Additionally, the invention can be used to create zones free of dielectric or resistive coating material on the metal substrate where metal deformation can take place without fracturing the dielectric or resistive layer or coating. This would allow bends to be made to form a right angle configuration after a thick film pattern has been placed on either or both sides of the device.

While the invention has been shown and described with respect to specific embodiments of the methods and products thereof, this is intended for the purpose of illustration rather than limitation and other variations and modifications of the specific methods and products herein shown and described may be used all within the intended spirit and scope of the invention. Accordingly, the invention is not to be limited in scope and effect to the specific embodiments herein shown and described nor in any other way that is inconsistent with the extent to which the progress in the art has been advanced by the invention.

We claim:

1. A method of making an electrical circuit device comprising the steps of:

forming a base of electrically conductive material, securing an electrically conductive masking element to a discrete surface portion of said base and in electrically conductive contact therewith, coating by electrophoresis other surface portions of said base with fusible particles of a coating material that is adhered to said other surface portions and repelled from the surface of said masking element whereby the surface of said masking element remains exposed, heating the resulting product to sintering temperature to fuse said particles and to provide a dielectric or resistive layer bonded to said other surface portions of said base whereby said masking element provides an exposed conductive path to said base.

2. A method as defined in claim 1, wherein said base is formed of a ferrous alloy.

3. A method as defined in claim 1, wherein said base is selected from the group consisting of stainless steel, copper, aluminum., copper alloy, carbon steel and decarburized steel.

4. A method as defined in claim 1, wherein said conductive masking element is formed of a nickel alloy.

5. A method as defined in claim 1, wherein said conductive masking element is formed of a composition comprising a nickel alloy film material.

6. A method as defined in claim 1, wherein said fusible particles comprise a porcelain enamel.

7. A method as set forth in claim 1 wherein said fusible particles comprise a glass or ceramic coating material.

8. A method as set forth in claims 1 wherein said fusible particles comprise a devitrified coating material.

9. A method as defined in claim 1, including the additional step of applying a conductive circuit pattern to the surface of said dielectric or resistive layer.

10. A method as defined in claim 9, wherein said conductive circuit pattern has a portion thereof in electrically conductive contact with said masking element.

11. A method as defined in claim 9, wherein said circuit pattern is formed of electrically conductive film material.

12. A method as defined in claim 1, including the step of adhering a section of conductive metal foil to said conductive masking element.

\* \* \* \* \*